United States Patent [19]

Kennedy

[11] Patent Number: 5,173,336

[45] Date of Patent: Dec. 22, 1992

[54] METAL ORGANIC CHEMICAL VAPOR DEPOSITION (MOCVD) REACTOR WITH RECIRCULATION SUPPRESSING FLOW GUIDE

[75] Inventor: Adam M. Kennedy, Goleta, Calif.

[73] Assignee: Santa Barbara Research Center, Goleta, Calif.

[21] Appl. No.: 643,400

[22] Filed: Jan. 22, 1991

[51] Int. Cl.⁵ .............................................. C23C 16/54
[52] U.S. Cl. .................................. 427/248.1; 427/250; 427/251; 427/252; 118/715; 118/729; 118/730
[58] Field of Search .................. 118/715, 729, 730; 427/248.1, 250, 251, 252

[56] References Cited

U.S. PATENT DOCUMENTS

| | | | |
|---|---|---|---|
| 4,909,914 | 3/1990 | Chiba et al. | 118/715 |
| 4,911,102 | 3/1990 | Manabe et al. | 118/715 |
| 4,920,920 | 5/1990 | Shigeki | 118/715 |
| 4,989,541 | 2/1991 | Mikoshiba et al. | 118/715 |
| 5,044,315 | 9/1991 | Ozias | 118/715 |

FOREIGN PATENT DOCUMENTS

| | | | |
|---|---|---|---|
| 61-002318 | 1/1986 | Japan | 118/715 |
| 63-143420 | 6/1987 | Japan | 118/715 |
| 63-006832 | 1/1988 | Japan | 118/715 |
| 63-124517 | 5/1988 | Japan | 118/715 |

Primary Examiner—Shrive Beck
Assistant Examiner—Bret Chen
Attorney, Agent, or Firm—W. C. Schubert; W. K. Denson-Low

[57] ABSTRACT

A semiconductor substrate or other object (32) for vapor deposition is mounted on a susceptor disk (16) which rotates about a vertical axis. Chemical vapor flows downwardly through a passageway (14) onto the object (32). A radial space (14a) is provided between the periphery of the disk (16) and an adjacent inner wall (12a) of the passageway (14). Rotation of the disk (16) urges a portion of the vapor flow (60) to be deflected from the disk (16) and the wall (12a) of the passageway (14) upwardly to cause deleterious recirculation of the vapor above the disk (16). A flow guide (52) disposed in the passageway (14) above the disk (16) has an upstream converging section (52a) which causes the flow (56) of vapor to accelerate, and a downstream diverging section (52b) which causes the accelerated flow (58) to expand downwardly and radially outwardly so as to interact with, and prevent upward movement of the deflected portion of the flow (60) and thereby suppress recirculation of the vapor.

6 Claims, 2 Drawing Sheets

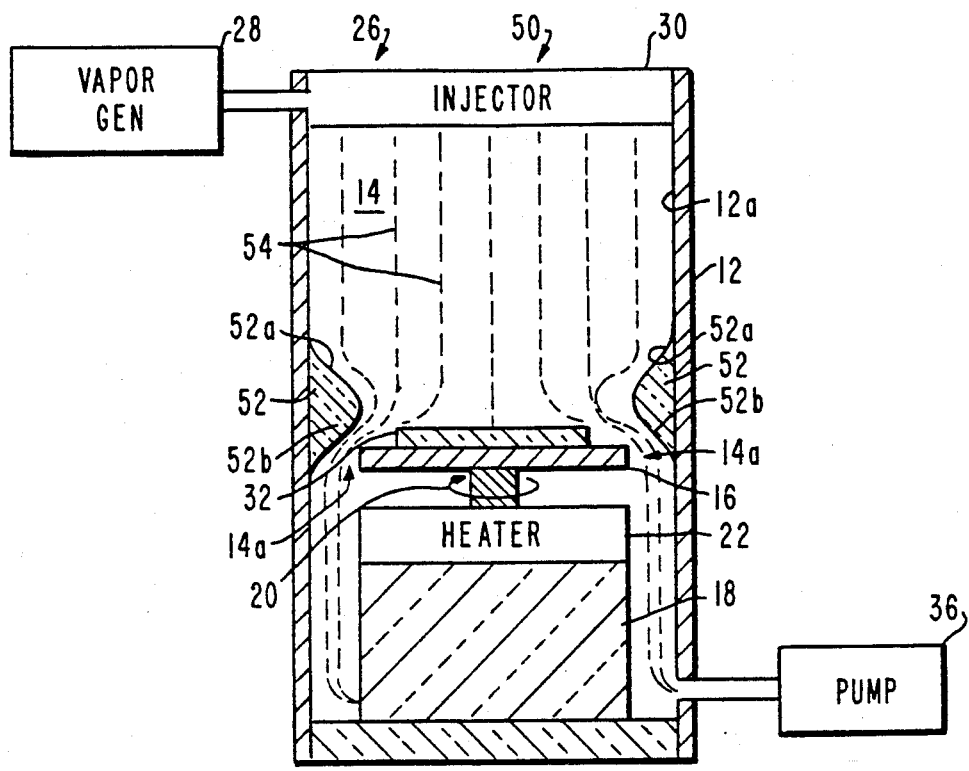
Fig. 3.
Fig. 4.
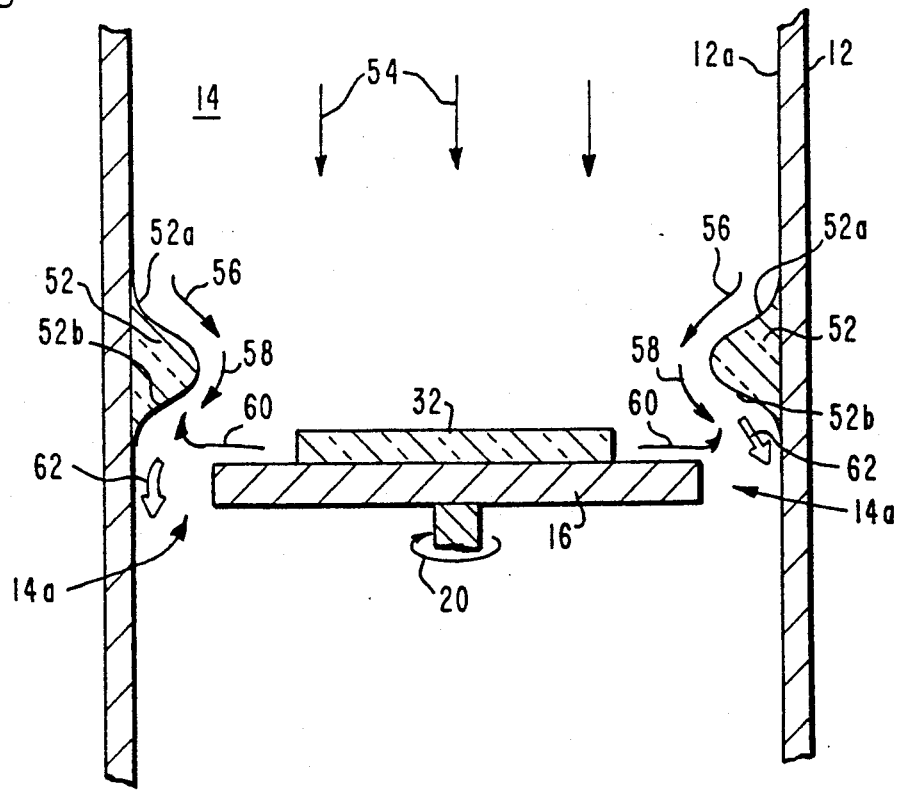

METAL ORGANIC CHEMICAL VAPOR DEPOSITION (MOCVD) REACTOR WITH RECIRCULATION SUPPRESSING FLOW GUIDE

BACKGROUND OF THE INVENTION

1. Field of the Invention

The present invention relates to a metal organic chemical vapor deposition (MOCVD) reactor including a flow guide for preventing recirculation of reactant vapor.

2. Description of the Related Art

The development of thin-film deposition processes for compound semiconductors is crucial to the advancement of sophisticated electronic and optoelectronic devices. High speed electronic transistors, quantum-well diode lasers, light-emitting diodes, photodetectors, and optical modulators are fabricated from structures composed of numerous epitaxial layers (epilayers) that range in thickness from several microns to as thin as a few tenths of a nanometer. These epilayers are deposited, or grown, on a single-crystal substrate whereby under the proper conditions the epilayer replicates the substrate so well that the two are often indistinguishable.

MOCVD, also known as organometallic vapor phase epitaxy (OMVPE), is a highly advantageous thin-film deposition process. Gaseous metal-organic and hydride chemical precursors or reactants are transported by a carrier gas to a hot substrate. Near the substrate surface, the gases pyrolize and deposition occurs by the recombination of atomic or molecular species. The thickness and composition of the epilayers that are formed can be controlled by adjusting various parameters such as the concentration of reactants, carrier-gas flow rate, reactor pressure, and growth time. MOCVD may be advantageously utilized for the formation of thin films of gallium arsenide (GaAs), aluminum gallium arsenide (AlGaAs), cadmium telluride (CdTe), and mercury cadmium telluride (HgCdTe).

MOCVD reactors are available in various configurations, including horizontal, vertical, and barrel. In a vertical reactor to which the present invention specifically relates, an object for deposition is mounted on a heated, rotating susceptor disk. A metal-organic vapor including chemical reactants suspended in an inert gaseous carrier such as hydrogen is generated and discharged into the upper portion of the reactor, and flows downwardly through a cylindrical shroud or passageway toward the rotating disk. In order to sustain the flow of vapor, a radial space is provided between the periphery of the disk and the inner wall of the passageway, and the lower portion of the reactor is subjected to reduced pressure. Thus, the portion of the vapor which is not deposited on the object flows downwardly through the radial space and out the reactor through the lower portion thereof.

The MOCVD process, however, has suffered from the drawback that precise control of film thickness, composition, and doping over large areas has heretofore been unattainable. Such control is crucial because advanced circuit concepts require the fabrication of multilayer structures that are highly uniform over large substrate areas.

A major cause of this and other problems in MOCVD is that under certain operating conditions, a large recirculation cell or vortex develops along the wall of the reactor and causes crystal structure and surface morphology problems. In the presence of recirculation, the MOCVD reactor cannot change the reactants quickly enough to obtain an abrupt interface between different types of epilayers such as n-type and p-type. Recirculation suspends reactants and doping constituents in the recirculation vortex above the growth surface after the flow of the reactants is shut off. The constituents are then present to deposit on the crystal substrate surface in a slowly decreasing concentration, resulting in a gradual interface change rather than the desired abrupt interface change. Defects form in the crystal around the precipitates, resulting in poor crystal structure and resulting poor performance of devices fabricated in the MOCVD epilayers.

SUMMARY OF THE INVENTION

The present invention provides a MOCVD reactor incorporating a flow guide having converging and diverging sections to embody a method of suppressing recirculation of metal-organic chemical vapor therein.

More specifically, a semiconductor substrate or other object for vapor deposition is mounted on a susceptor disk which rotates about a vertical axis. Chemical vapor flows downwardly through a passageway onto the object. A radial space is provided between the periphery of the disk and an adjacent inner wall of the passageway. Rotation of the disk urges a portion of the vapor flow to be deflected from the disk and subsequently from the wall of the passageway upwardly to cause deleterious recirculation of the vapor above the disk. A flow guide disposed in the passageway above the disk has an upstream converging section which causes the flow of vapor to accelerate, and a downstream diverging section which causes the accelerated flow to expand downwardly and radially outwardly so as to interact with, and prevent upward movement of the deflected portion of the flow and thereby suppress recirculation of the vapor.

Elimination of recirculation enables the formation of an improved crystal structure within epitaxially deposited layers, and better surface morphology on the completed layer grown by MOCVD. This is accomplished by reducing or eliminating the opportunity for precipitates to form above the crystal growing surface. In addition, elimination of recirculation enables the reactant constituents to be changed abruptly. The sharp change in constituents allows growth of differing layers with very discrete boundaries between the layers. The present flow guide also provides the advantage of allowing a wider range of operating conditions (total gas flow, reactant pressure, wall temperature, etc.) under which recirculation-free flow can be obtained, thereby allowing greater freedom for process optimization.

These and other features and advantages of the present invention will be apparent to those skilled in the art from the following detailed description, taken together with the accompanying drawings, in which like reference numerals refer to like parts.

DESCRIPTION OF THE DRAWINGS

FIG. 3 is a simplified vertical sectional view of a MOCVD reactor embodying the present invention; and FIG. 4 is a fragmentary vertical sectional view of the reactor of FIG. 3, illustrating how recirculation of chemical vapor is suppressed by the method of the present invention.

DETAILED DESCRIPTION OF THE INVENTION

Figure 1:
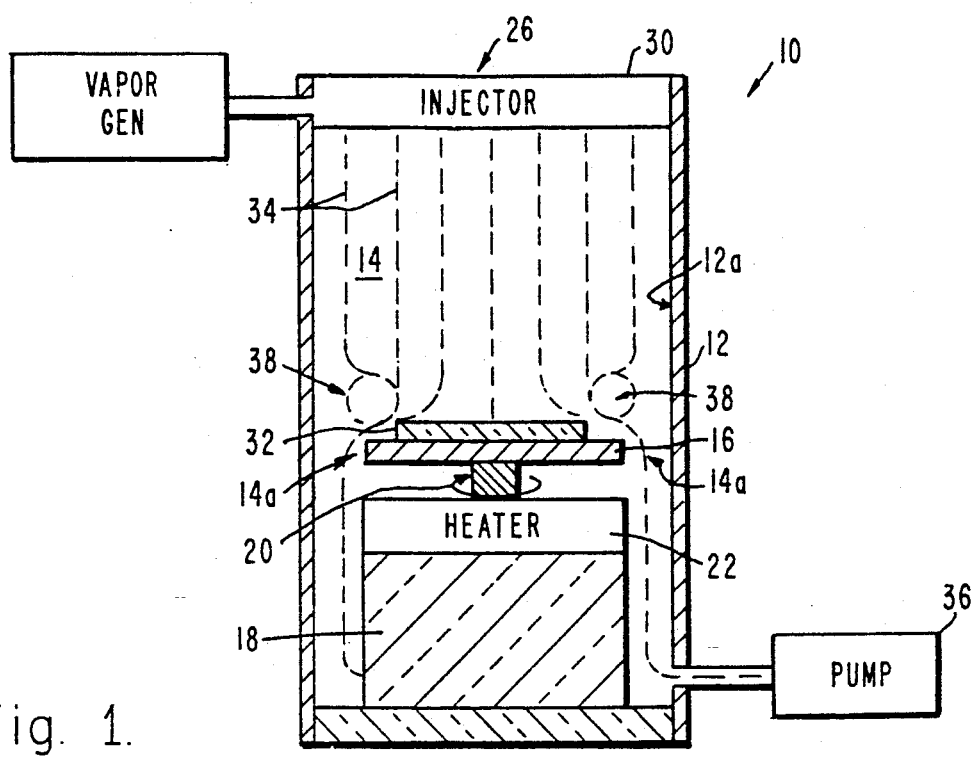
FIG. 1 is a simplified vertical sectional view of a conventional MOCVD reactor.

Referring now to FIG. 1 of the drawing, a conventional MOCVD apparatus or reactor is generally designated as 10, and includes a vertically oriented reaction chamber 12. An inner wall 12a of the chamber 12 is generally cylindrical, and defines a vertical flow passageway 14 therein. The inner wall 12a of the chamber 12 thereby constitutes the inner all of the passageway 14.

A susceptor in the form of a rotating disk 16 is mounted on a suitable support 18 inside the passageway 14 and rotatably driven by a motor (not shown). The axis of rotation of the disk 16 is vertical, and lies in the plane of the drawing as indicated by an arrow 20. The disk 16 is made of a material such as graphite or molybdenum, and radiantly heated to a suitable temperature by an electric heater 22 located under the disk 16.

A chemical vapor is generated by a vapor source 26, which includes a chemical vapor generator 28 and a discharge injector 30. The injector 30 injects the vapor into the chamber 12 so that it flows substantially downwardly parallel to the axis of rotation of the disk 16 onto an object 32 mounted on the disk 22. The flow of vapor through the passageway 14 is illustrated by dashed streamlines which are collectively designated as 34. The object 32 may be a semiconductor substrate on which is to be deposited one or more epitaxial layers of material from the flow of vapor 34.

Flow of vapor downwardly through the passageway 14 is induced by a vacuum pump 36 which communicates with the lower portion of the passageway 14. The pump 36 also collects a residual portion of the vapor which was not deposited on the object 32. A radial space 14a is necessarily provided between the periphery of the disk 16 and the inner wall 12a of the chamber 12 to allow downward flow of vapor through the passageway 14 to occur.

The chemical vapor generated by the source 26 generally includes a reactant material suspended in a carrier gas. Where the object 32 is a gallium arsenide substrate, the reactant material will include trimethylgallium, trimethylaluminum, and arsine. The carrier gas will typically be hydrogen, with the object 32 heated to a temperature on the order of 700° C. Where the object 32 is a cadmium telluride substrate, the reactant material will include dimethylcadmium and diethyltellurium. The carrier gas will typically be hydrogen, with the object heated to a temperature on the order of 400° C. Where photoassisted MOCVD is performed using a laser (not shown) to irradiate the flow just above the object 32 with high intensity illumination to assist decomposition of the metal organic molecules, the object 32 may be heated to a lower temperature, on the order of 200° C.

The conventional MOCVD reactor 10 suffers from the effects of chemical vapor recirculation as described above. A recirculation cell or vortex 38 having a generally toroidal shape forms along the inner wall 12a of the chamber 12 above the periphery of the disk 16. The vortex 38 is responsible for the deleterious effects of recirculation described above.

Figure 2:
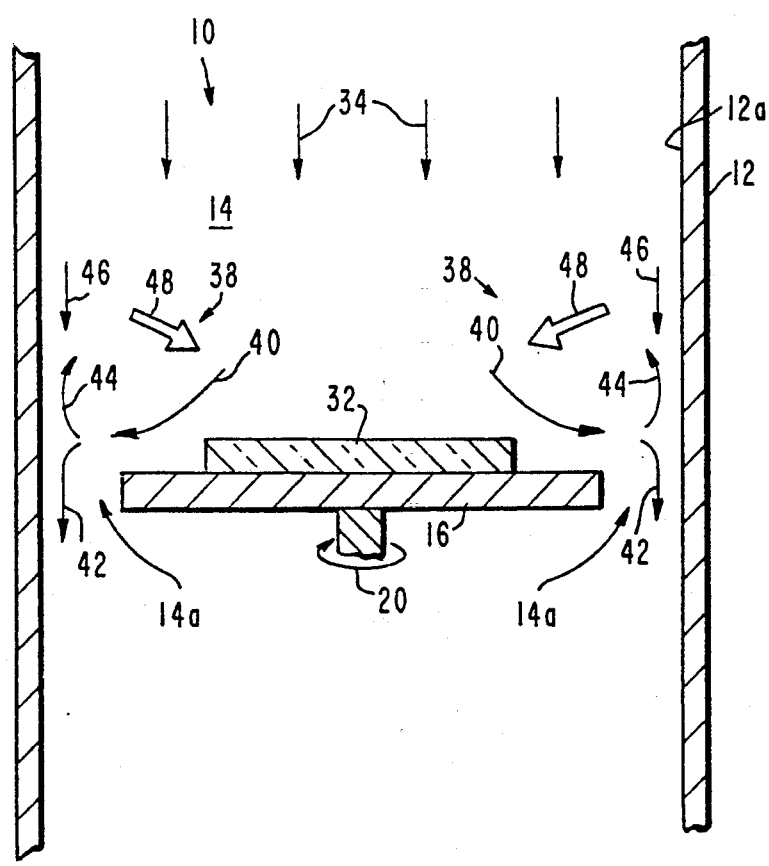
FIG. 2 is a fragmentary vertical sectional view of the reactor of FIG. 1, illustrating the cause of recirculation therein.

The present invention is based on a realization of the cause of the recirculation, and the provision of a method of eliminating or suppressing the cause. As shown in FIG. 2, rotation of the disk 16 creates inertial and viscous forces which cause a portion of the initially downward flow 34 to be deflected radially outwardly from the disk 16 as illustrated by arrows 40. The outwardly deflected flow portion 40 impinges against the inner wall 12a of the chamber 12. A portion of the flow portion 40 is deflected downwardly from the wall 12a as illustrated by arrows 42. Another portion of the flow portion 40 is deflected upwardly, or back toward the vapor source 26, as illustrated by arrows 44. A portion of the downward flow 34 adjacent to the inner wall 12a is illustrated by arrows 46. The flow 44 portion which is deflected back toward the vapor source 26 interacts with the downwardly moving flow portion 46 to form the recirculation vortex 38 as illustrated by arrows 48.

As illustrated in FIG. 3, a MOCVD reactor embodying the present invention is generally designated as 50, and includes a flow guide 52 for preventing any portion of the chemical vapor flow from being deflected back toward the vapor source 26, thereby suppressing recirculation. The flow guide 52 may be formed as an integral part of the inner wall 12a of the chamber 12, or may be provided as a separate shroud or insert. The latter alternative enables existing MOCVD reactors to be retrofit with the present flow guide 52. The flow of chemical vapor in the present reactor 50 is free of recirculation vortices, as illustrated by dashed streamlines 54.

As also shown in FIG. 4, the flow guide 52 has an upstream converging section 52a and a downstream diverging section 52b. The converging section 52a causes the flow 54 to converge and accelerate. The radially outer portion of the converging flow 54 is illustrated by arrows 56. The diverging section 52b causes the flow 54 to subsequently expand. The radially outer portion of the expanding flow 54 is illustrated by arrows 58. The expanding flow portion 58 moves downwardly and radially outwardly along the surface of the diverging section 52b.

A portion of the flow 54 which is deflected radially outwardly by centrifugal force due to rotation of the disk 16 and deflected upwardly by the inner wall 12a of the chamber 12 as described above as illustrated by arrows 60. The flow portion 60 moves in a generally upward direction which at least partially opposes the main flow 54. However, the expanding flow portion 58 interacts with and prevents the flow portion 60 from moving upwardly, or back toward the vapor source 26. In order to accomplish this, the expanding flow portion 58 must have sufficient energy to suppress the flow portion 60. This is made possible by providing the upstream converging section 52a which accelerates the flow as illustrated at 56 and sets up the necessary flow conditions for the downstream diverging section 52b of the flow guide 52 as illustrated at 58. The flow portion 58 interacts with the flow portion 60 to produce a resultant flow portion as illustrated by arrows 62. The flow portion 62 moves downwardly through the radial space 14a without recirculation in the desired manner, rather than moving upwardly as illustrated in FIG. 2 at 48.

Both the converging and diverging sections of the flow guide appear to be necessary to suppress recirculation. Attempts to produce the desired results using only a diverging flow guide were unsuccessful. However, the shape of the flow guide 52 may be varied to a considerable extent to accommodate a particular application. Although the flow guide 52 illustrated in the present drawings has symmetrical converging and diverging sections, the flow guide may be asymmetrical, with either section being larger than the other, and/or the sections having different curvatures.

The variables involved in determining the optimal shape for the present flow guide 52 are complex, and the actual design procedure will generally be at least partially empirical. The procedure described in, for example, an article entitled "A New Organometallic Vapor Phase Epitaxy Reactor for Highly Uniform Epitaxy", by C. Wang, The Lincoln Laboratory Journal, vol. 3, no. 1 (June 12, 1990), pp. 3-22, which combines gas flow visualization and numerical modeling, is suitable for the optimization of a flow guide embodying the present invention.

In the MOCVD reactor described above and illustrated in the present drawings, the susceptor or disk 16 is heated to achieve the necessary pyrolization of reactants in the chemical vapor. The method of the invention is not limited to MOCVD reactors, but may also be applied to CVD reactors in which the susceptor is not heated, and to other types of chemical deposition apparatus having rotating disks which create the problem of chemical vapor recirculation.

While several illustrative embodiments of the invention have been shown and described, numerous variations and alternate embodiments will occur to those skilled in the art, without departing from the spirit and scope of the invention. Accordingly, it is intended that the present invention not be limited solely to the specifically described illustrative embodiments. Various modifications are contemplated and can be made without departing from the spirit and scope of the invention as defined by the appended claims.

I claim:

1. In a chemical vapor deposition apparatus including a rotating disk for supporting an object, vapor source means for generating a flow of chemical vapor toward the object for deposition thereon, and passageway means having an inner wall for guiding said flow from the vapor source means parallel to the axis of rotation of the disk onto the object, the disk being disposed inside the passageway means with a radial space provided between the periphery of the disk and the inner wall of the passageway means, rotation of the disk urging a portion of said flow to be deflected from the disk and subsequently from the inner wall of the passageway means back toward the vapor source means, the improvement including flow guide means disposed in the passageway means between the vapor source means and the disk, the flow guide means comprising:
    an upstream converging section for causing said flow to accelerate; and
    a downstream diverging section for subsequently causing said flow to expand, interact with, and prevent said portion of said flow from being deflected back toward the vapor source means, said upstream converting section and said downstream diverging section located in said passageway proximate said rotating disk so that said portion of said flow is deflected in a direction away from said source means and beyond said rotating disk by said accelerated flow.

2. An apparatus as in claim 1, in which:
    the vapor source means generates said flow as a flow of metal-organic vapor; and
    the apparatus further comprises heater means for heating the disk and the object.

3. An apparatus as in claim 1, in which:
    the axis of rotation of the disk is vertical; and
    the vapor source means is disposed above the disk.

4. A chemical vapor deposition method, comprising the steps of:
    (a) supporting an object for deposition on a rotating disk disposed inside an inner wall of a passageway, such that a radial space is provided between the periphery of the disk and the inner wall;
    (b) generating a flow of chemical vapor through the passageway substantially parallel to the axis of rotation of the disk onto the object, rotation of the disk urging a portion of said flow to be deflected from the disk and subsequently from the inner wall in a direction which is at least partially opposed to said flow;
    (c) causing said flow to converge and thereby accelerate upstream of the disk; and
    (d) subsequently, within said passageway upstream but proximate to said disk, causing said flow to diverge, interact with, and prevent said portion of said flow from being deflected in said direction.

5. A method as in claim 4, in which:
    step (a) further comprises heating the disk and the object; and
    step (b) comprises generating said flow as a flow of metal-organic vapor.

6. A method as in claim 4, in which:
    step (a) further comprises orienting the disk such that the axis of rotation thereof is vertical; and
    step (b) comprises generating said flow downwardly onto the object.

* * * * *